(12) United States Patent
Eom et al.

(10) Patent No.: US 12,256,596 B2
(45) Date of Patent: *Mar. 18, 2025

(54) DISPLAY APPARATUS

(71) Applicant: Samsung Display Co., Ltd., Yongin-si (KR)

(72) Inventors: Taeyong Eom, Suwon-si (KR); Yeri Jeong, Suwon-si (KR); Youngbae Jung, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/472,797

(22) Filed: Sep. 22, 2023

(65) Prior Publication Data
US 2024/0015998 A1    Jan. 11, 2024

Related U.S. Application Data

(63) Continuation of application No. 17/552,613, filed on Dec. 16, 2021, now Pat. No. 11,800,745, which is a
(Continued)

(30) Foreign Application Priority Data
Oct. 4, 2018 (KR) .................. 10-2018-0117968

(51) Int. Cl.
H10K 50/858 (2023.01)
H10K 50/80 (2023.01)
H10K 50/84 (2023.01)

(52) U.S. Cl.
CPC ........... *H10K 50/858* (2023.02); *H10K 50/84* (2023.02); *H10K 50/868* (2023.02)

(58) Field of Classification Search
None
See application file for complete search history.

(56) References Cited

U.S. PATENT DOCUMENTS 7,173,289 B1    2/2007   Wu et al.
9,256,075 B2    2/2016   Jeong et al.
(Continued)

FOREIGN PATENT DOCUMENTS

JP    H 05-249449    9/1993
JP    H 07-92312 A    4/1995
(Continued)

OTHER PUBLICATIONS

Chinese Notice of Examination Report dated Jun. 14, 2024, issued in corresponding Chinese Patent Application No. 201910932388.1 (2 pages).
(Continued)

Primary Examiner — Xiaoming Liu
(74) Attorney, Agent, or Firm — Lewis Roca Rothgerber Christie LLP

(57) ABSTRACT

Provided is a display apparatus. The display apparatus includes a display module configured to define a display surface on a plane. The display module includes a display panel having a plurality of display elements configured to display an image on the display surface and a pattern layer having a plurality of diffraction patterns arranged at an interval on the display panel. The diffraction patters are arranged to diffract at least a portion of incident light. At least a portion of the diffraction patterns has a width different from that of each of remaining diffraction patterns.

16 Claims, 19 Drawing Sheets

Related U.S. Application Data continuation of application No. 16/561,712, filed on Sep. 5, 2019, now Pat. No. 11,233,224.

(56) References Cited

U.S. PATENT DOCUMENTS

| | | | |
|---|---|---|---|
| 9,291,859 B2 | 3/2016 | Park et al. | |
| 11,233,224 B2* | 1/2022 | Eom | H10K 50/84 |
| 11,800,745 B2* | 10/2023 | Eom | H10K 59/879 |
| 2006/0175962 A1 | 8/2006 | Fujimoto et al. | |
| 2008/0176041 A1* | 7/2008 | Sato | G02B 5/0278 |
| | | | 428/161 |
| 2010/0055402 A1* | 3/2010 | Yamashita | G02B 1/105 |
| | | | 428/156 |
| 2015/0362634 A1* | 12/2015 | Iwase | G02B 1/118 |
| | | | 359/601 |
| 2017/0263691 A1* | 9/2017 | Seo | H10K 59/353 |
| 2018/0011237 A1 | 1/2018 | Fattal | |
| 2018/0128962 A1 | 5/2018 | Kim et al. | |
| 2018/0314067 A1 | 11/2018 | Cho et al. | |
| 2019/0094541 A1 | 3/2019 | Choi et al. | |

FOREIGN PATENT DOCUMENTS

| | | |
|---|---|---|
| KR | 10-2012-0074966 | 7/2012 |
| KR | 10-2014-0058974 A | 5/2014 |
| KR | 10-1756669 B1 | 7/2017 |
| KR | 10-2017-0106088 A | 9/2017 |
| KR | 10-2018-0121750 A | 11/2018 |
| KR | 10-2019-0034380 A | 4/2019 |

OTHER PUBLICATIONS

Chinese Examination Report dated Jan. 24, 2025, issued in corresponding Chinese Patent Application No. 201910932388.1 (2 pages).

* cited by examiner

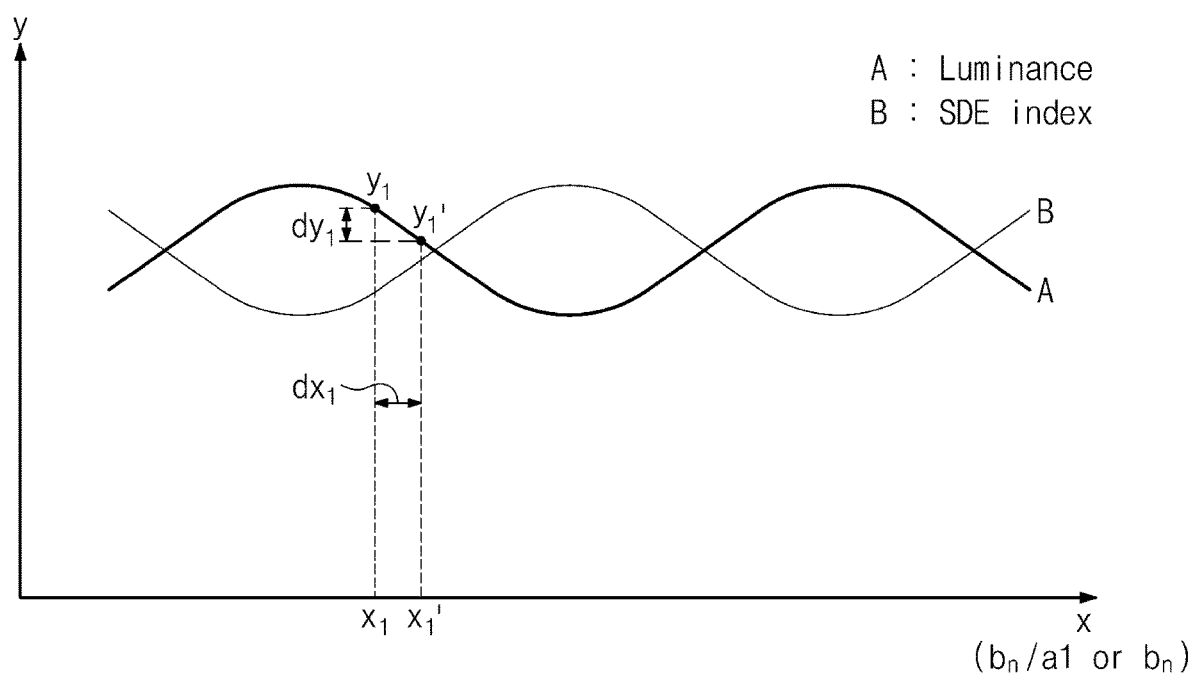

DISPLAY APPARATUS

CROSS-REFERENCE TO RELATED APPLICATIONS

This patent application is a continuation of U.S. patent application Ser. No. 17/552,613, filed on Dec. 16, 2021, which is a continuation of U.S. patent application Ser. No. 16/561,712, filed Sep. 5, 2019, now U.S. Pat. No. 11,233,224, and entitled DISPLAY APPARATUS which claims priority to and the benefit of Korean Patent Application No. 10-2018-0117968, filed on Oct. 4, 2018, the entire contents of all of which are hereby incorporated by reference.

BACKGROUND

The present disclosure herein relates to a display apparatus having improved display quality.

Display apparatuses are becoming increasingly important with the development of multimedia. Accordingly, various types of display apparatuses such as liquid crystal displays (LCDs), organic light emitting displays (OLEDs), and the like are used.

In the case of the organic light emitting displays (OLEDs), emission areas surrounded by non-emission areas may be defined on a display surface on which an image is displayed. When a display's resolution is low, or the display surface is enlarged, the non-emission areas may be visible by a user.

SUMMARY

The present disclosure provides a display apparatus having improved display quality.

An embodiment of the inventive concept provides a display apparatus including a display module configured to define a display surface on a plane. The display module includes: a display panel including a plurality of display elements configured to display an image on the display surface; and a pattern layer including a plurality of diffraction patterns arranged at an interval on the display panel, wherein the pattern layer is configured to diffract at least a portion of incident light, wherein at least a portion of the plurality of diffraction patterns has a width different from that of each of remaining diffraction patterns.

In an embodiment, the at least the portion of the incident light diffracted by the diffraction patterns may be constructively interfered.

In an embodiment, each of the plurality of display elements is configured to display pixel unit images on the display surface, the constructively interfered incident light may display duplicate pixel unit images between adjacent display elements, and the image may be defined by the pixel unit images and the at least duplicate unit images.

In an embodiment, the plurality of diffraction patterns includes a plurality of hole shapes passing through the pattern layer.

In an embodiment, the plurality of diffraction patterns may include: first patterns, each of which has a first width; and second patterns, each of which has a second width that is greater than the first width.

In an embodiment, a ratio of the second patterns to the first patterns on the pattern layer may be in a range of about 20% to about 80%.

In an embodiment, the number of the first patterns may be the same as that of the second patterns on the pattern layer.

In an embodiment, a ratio of the width of each of the diffraction patterns to the interval of the diffraction patterns may be in a range of about 5% to about 95%.

In an embodiment, the diffraction patterns may further include third patterns, each of which has a third width that is less than the first width.

In an embodiment, the first patterns may form a plurality of first columns on the plane, the second patterns may form a plurality of second columns on the plane, and the first columns and the second columns may be alternately arranged.

In an embodiment, the first patterns and the second patterns may be alternately arranged on the plane in a first direction and a second direction perpendicular to the first direction.

In an embodiment, the display panel may include: a base layer; a circuit layer on the base layer and comprising the plurality of display elements; and an encapsulation layer on the circuit layer and having the same refractive index as the pattern layer.

In an embodiment, the encapsulation layer may include the same material as the pattern layer.

In an embodiment, each of the plurality of diffraction patterns may have a shape that protrudes upward from a top surface of the display module.

In an embodiment, each of the plurality of diffraction patterns may have a circular shape on the plane.

In an embodiment, each of the plurality of diffraction patterns may have a polygonal shape on the plane.

In an embodiment, each of the plurality of display elements may include an organic light emitting element.

In an embodiment, the display apparatus may further include an antireflection layer on the display module, wherein the antireflection layer may include: a phase retardation layer that is configured to retard a phase of one component of the incident light; and a polarizing layer on the phase retardation layer.

In an embodiment of the inventive concept, a display apparatus including a display module configured to define a display surface on a plane. The display module includes: a plurality of organic light emitting elements configured to display an image on the display surface; an encapsulation layer configured to cover the plurality of organic light emitting elements; and a pattern layer on the encapsulation layer and having a same refractive index as the encapsulation layer, wherein the pattern layer includes a plurality of diffraction patterns arranged at an interval configured to constructively interfere with at least a portion of incident light generated by the plurality of organic light emitting elements, and the plurality of diffraction patterns comprise a plurality of patterns having widths different from each other.

In an embodiment of the inventive concept, a display apparatus includes: a base layer; a display layer on the base layer and comprising a plurality of organic light emitting elements; an encapsulation substrate on the display layer; and a pattern layer including the same material as the encapsulation layer, wherein a plurality of diffraction patterns having a constant interval is defined in the pattern layer, and the plurality of diffraction patterns includes: first patterns, each of which has a first width; and second patterns, each of which has a second width greater than the first width, wherein the first patterns cause constructive interference with the second patterns.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIG. 9 is a graph illustrating a relative relationship between luminance and an SDE index of a display apparatus according to a width of each of patterns of FIGS. 8A and 8B;

DETAILED DESCRIPTION

Figure 1:
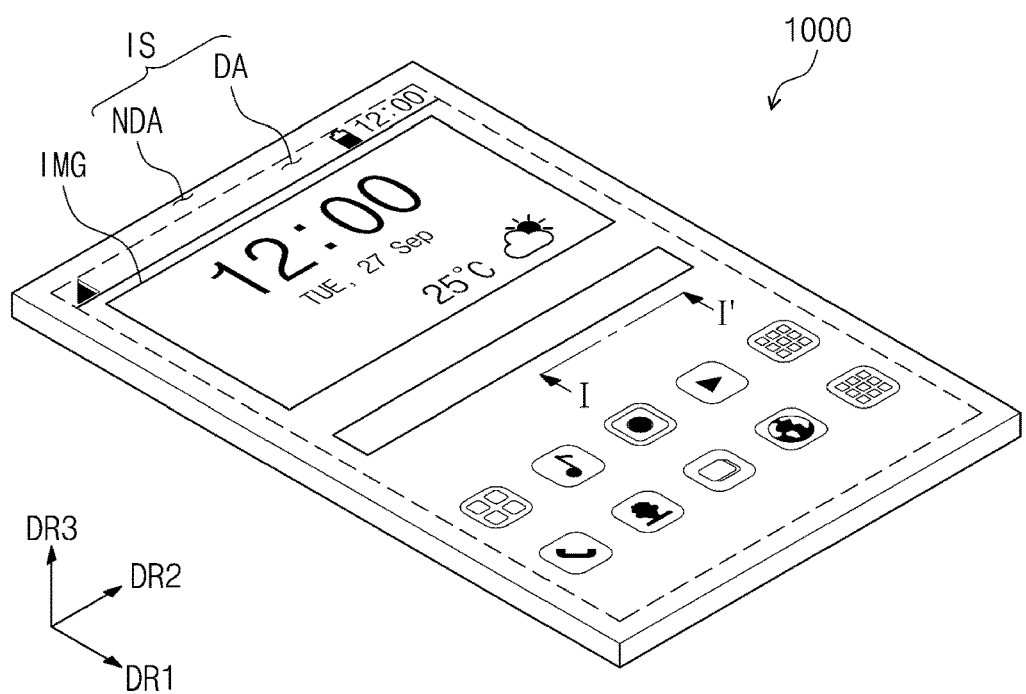
FIG. 1 is a perspective view of a display apparatus according to an embodiment of the inventive concept.

Hereinafter, example embodiments of a display apparatus will be described in more detail with reference to the accompanying drawings, in which like reference numbers refer to like elements throughout. The exemplary embodiments of the inventive concept, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the inventive concept may not be described. Unless otherwise noted, like reference numerals denote like elements throughout the attached drawings and the written description, and thus, descriptions thereof may not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the inventive concept.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the inventive concept. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

The display apparatus and/or any other relevant devices or components according to embodiments of the inventive concept described herein may be implemented utilizing any suitable hardware, firmware (e.g., an application-specific integrated circuit), software, or a combination of software, firmware, and hardware. For example, the display apparatus may include a display module having a display panel that includes a plurality of display elements (e.g., pixels), a pattern layer on the display panel, an input sensing layer on the pattern layer, an antireflection layer on the input sensing layer, and a window on the antireflection layer. The various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Hereinafter, exemplary embodiments of the inventive concept will be described with reference to the accompanying drawings.

Figure 2:
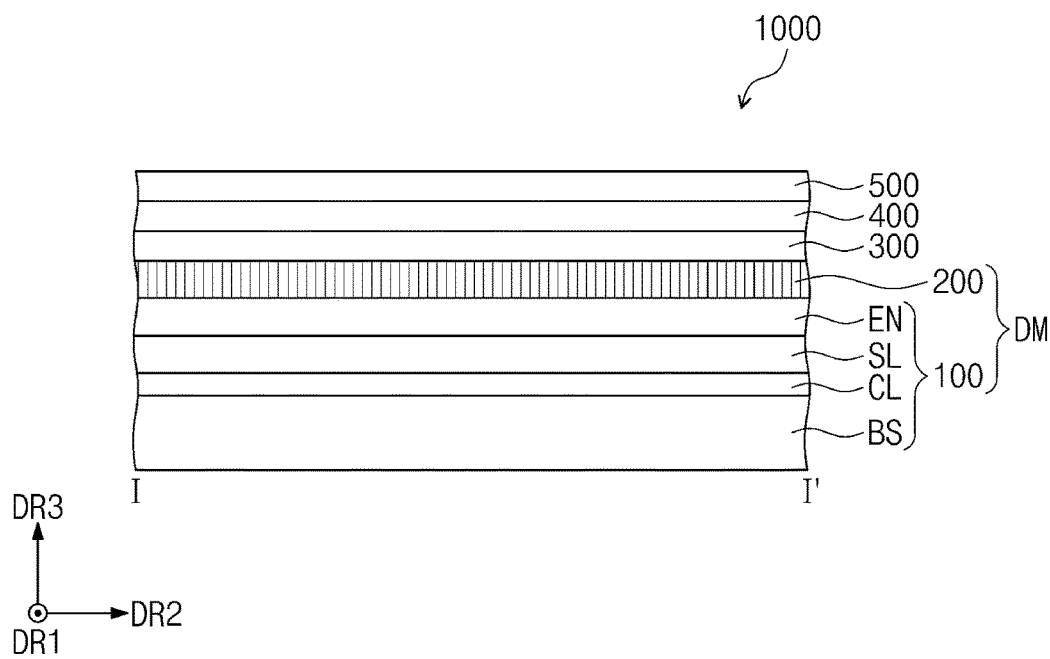
FIG. 2 is a cross-sectional view taken along the line I-I' of FIG. 1.

FIG. 1 is a perspective view of a display apparatus according to an embodiment of the inventive concept, and FIG. 2 is a cross-sectional view taken along the line I-I' of FIG. 1.

Referring to FIGS. 1 and 2, a display apparatus 1000 according to an embodiment of the inventive concept, has a rectangular shape with a long side in a first direction DR1 and a short side in a second direction DR2 perpendicular to the first direction DR1. For convenience of description, the shape of the display apparatus 1000 is merely an example, and the embodiment of the inventive concept is not limited to the shape of the display apparatus 1000. For example, various embodiments of the inventive concept may have any suitable shape including various regular or irregular shapes as would be understood by those skilled in the art.

The display apparatus 1000 has a display surface IS including a display area DA and a non-display area NDA on a plane defined by the first direction DR1 and the second direction DR2. The display area DA is defined at a central area of the display apparatus 1000. An image IMG may be displayed on the display area DA. The non-display area NDA has a frame shape around (e.g., surrounding) the display area DA on the plane. An image is not displayed on the non-display area NDA. The embodiment of the inventive concept is not specifically limited to the shapes of the display area DA and the non-display area NDA.

In this embodiment, a normal direction of the display surface IS, i.e., a direction in which the image IMG is displayed may be indicated as a third direction DR3. A front surface (or a top surface) and a rear surface (or a bottom surface) of each of members is indicated by the third direction DR3. The front surface (or the top surface) and the rear surface (or the bottom surface) of each of the members may be distinguished by the third direction DR3. However, directions indicated by the first to third directions DR1, DR2, and DR3 may be a relative concept and thus may be changed into different directions.

The display apparatus 1000 includes a display module DM. The display surface IS may be defined on a top surface of the display module DM. The display module DM includes a display panel 100 having a plurality of display elements (e.g., pixels) and a pattern layer 200 disposed on the display panel 100. The pattern layer 200 diffracts at least a portion of light provided from the display panel 100 to display an image on the display surface IS. The display panel 100 and the pattern layer 200 will be described in more detail with reference to FIGS. 3-11.

The display apparatus 1000 according to this embodiment may further include an input sensing layer 300, an antireflection layer 400, and a window 500.

The input sensing layer 300 is disposed on the display module DM. The input sensing layer 300 senses an external input provided to the display apparatus 1000.

For example, the input sensing layer 300 may sense an external input provided by the human body of a user (e.g., using a finger). According to the inventive concept, the external input is not limited to a specific method. According to another embodiment of the inventive concept, the external input may be provided in any suitable manner such as an optical, touch, magnetic, or other suitable manner as would be understood by those skilled in the art.

Although not shown, the input sensing layer 300 may include a plurality of input sensing electrodes for sensing the external input.

The input sensing layer 300 may sense the external input in various manners. For example, the input sensing layer 300 may be driven in a capacitance, resistive, or coordinate recognition manner.

The antireflection layer 400 is disposed on the input sensing layer 300. The antireflection layer 400 overlaps the display area DA on the plane. The antireflection layer 400 may prevent external light (e.g., incident on the display apparatus 1000) from being reflected by the display module DM and visible to the user. Although not shown, the antireflection layer 400 may include a polarizing layer and a phase retardation layer.

The polarizing layer has a transmission axis and an absorption axis perpendicular to the transmission axis. One or more components of external light incident on the polarizing layer may be absorbed into or reflected by the absorption axis so that the light does not pass the polarizing layer. A component perpendicular to the one component of the components of the external light incident on the polarizing layer (e.g., incident light) may pass through the polarizing layer. That is, the polarizing layer may linearly polarize the external light.

In this embodiment, the polarizing layer may be made of a polymer resin elongated in a specific direction. However, the embodiment of the inventive concept is not limited to a kind of polarizing layer. In another embodiment of the inventive concept, the polarizing layer may be a wire grid polarizer.

The phase retardation layer is disposed below the polarizing layer. The phase retardation layer has optical anisotropy. Thus, the phase retardation layer may retard a phase of one or more components of incident light. That is, the phase retardation layer may convert a polarized state of the light. For example, the phase retardation layer may retard a phase of one component of the incident light by a wavelength of about $\lambda/4$. That is, the phase retardation layer may be a quadrature wavelength film. Thus, the phase of the one component of the light passing through the phase retardation layer may be retarded to convert the linearly polarized state into a circularly polarized state or convert the circularly polarized state into the linearly polarized state.

According to this embodiment, even though the external light incident on the display apparatus 1000 from the outside is reflected by the display module DM, the polarized state may be converted by the phase retardation layer for the light to be absorbed or reflected by the polarizing layer. That is, the external light reflected by the display module DM may be invisible from the outside of the display apparatus 1000.

Although the antireflection layer 400 is disposed above the display panel 100 in this embodiment, the various embodiments of the inventive concept are not limited thereto. For example, according to another embodiment of the inventive concept, the antireflection layer 400 may be disposed in the display panel 100.

The window 500 is disposed on the antireflection layer 400. The window 500 provides a front surface of the display apparatus 1000 to protect the antireflection layer 400, the input sensing layer 300, and the display module DM. For example, the window 500 may include a glass substrate, a sapphire substrate, or a plastic film. The window 500 may have a single or multilayered structure. For example, the window 500 may have a laminated structure of a plurality of plastic films coupled to each other by using an adhesive or a laminated structure of a glass substrate and a plastic film, which are coupled to each other by using an adhesive.

Although not shown, the display apparatus 1000 may further include a plurality of adhesion members. The adhesion members may be disposed between input sensing layer 300 and the antireflection layer 400 so that the input sensing layer 300 and the antireflection layer 400 are coupled to each other. Also, the adhesion members may be disposed between the antireflection layer 400 and the window 500 so that the antireflection layer 400 and the window 500 are coupled to each other.

According to another embodiment of the inventive concept, at least one of the input sensing layer 300, the antireflection layer 400, or the window 500 may be omitted.

Figure 3:
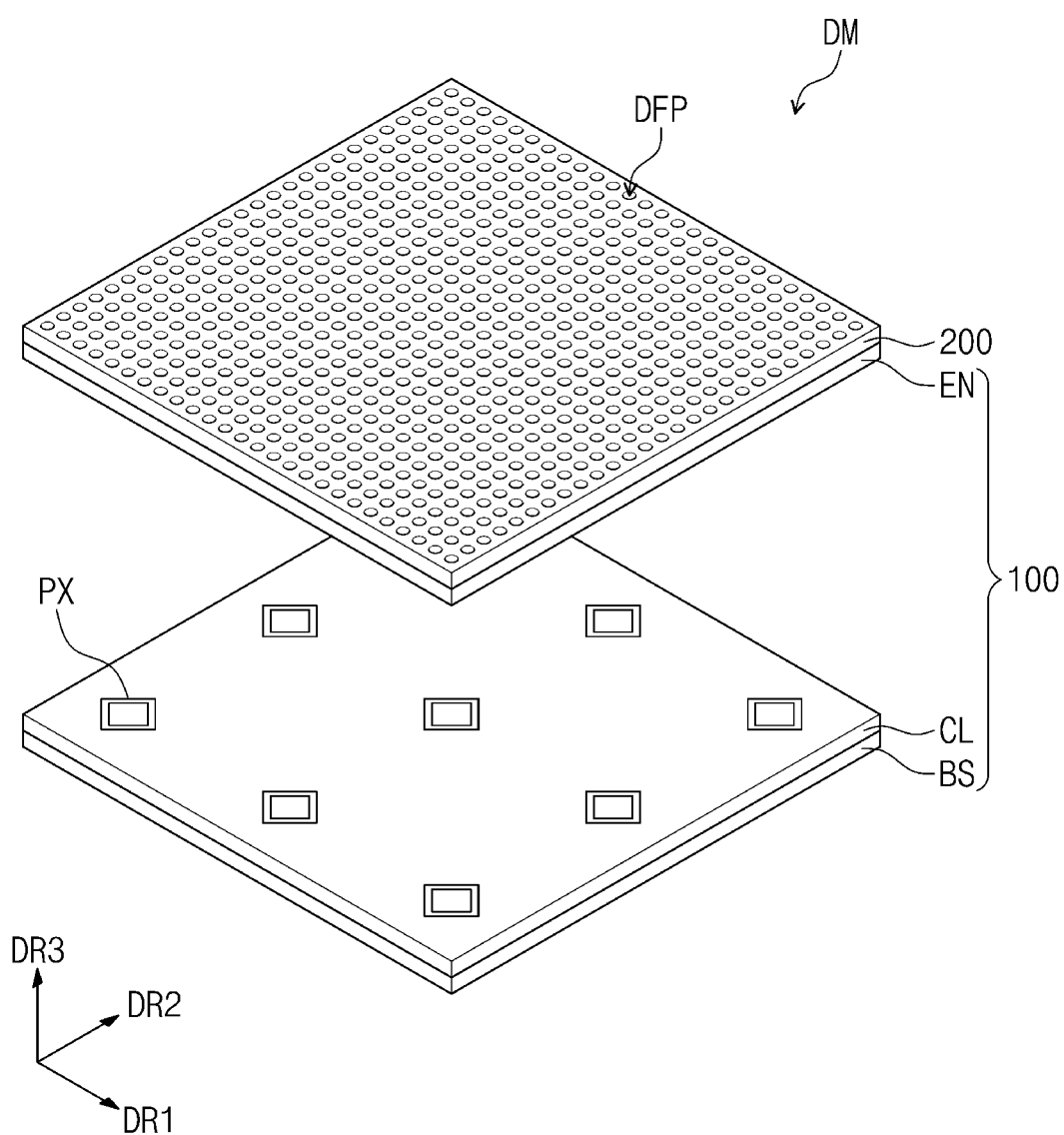
FIG. 3 is an enlarged perspective view illustrating a portion of an area of a display module of FIG. 2.

FIG. 3 is an enlarged perspective view illustrating a portion of an area of the display module of FIG. 2.

For convenience of description, a sub encapsulation layer SL of FIG. 2 is omitted in FIG. 3.

Referring to FIGS. 2 and 3, the display panel 100 according to an embodiment of the inventive concept may be an organic light emitting display panel. Thus, each of the display elements of the display panel 100 according to this embodiment may be an organic light emitting element OLED (see FIGS. 4 and 5).

Particularly, the display element may include a base layer BS, a display layer CL, an encapsulation layer EN, and the sub encapsulation layer SL. The base layer BS defines a rear surface of the display panel 100. The base layer BS may be a base layer for forming electrodes including the display panel 100 and display elements. For example, the base layer BS may be provided as the form of a substrate.

Figure 5:
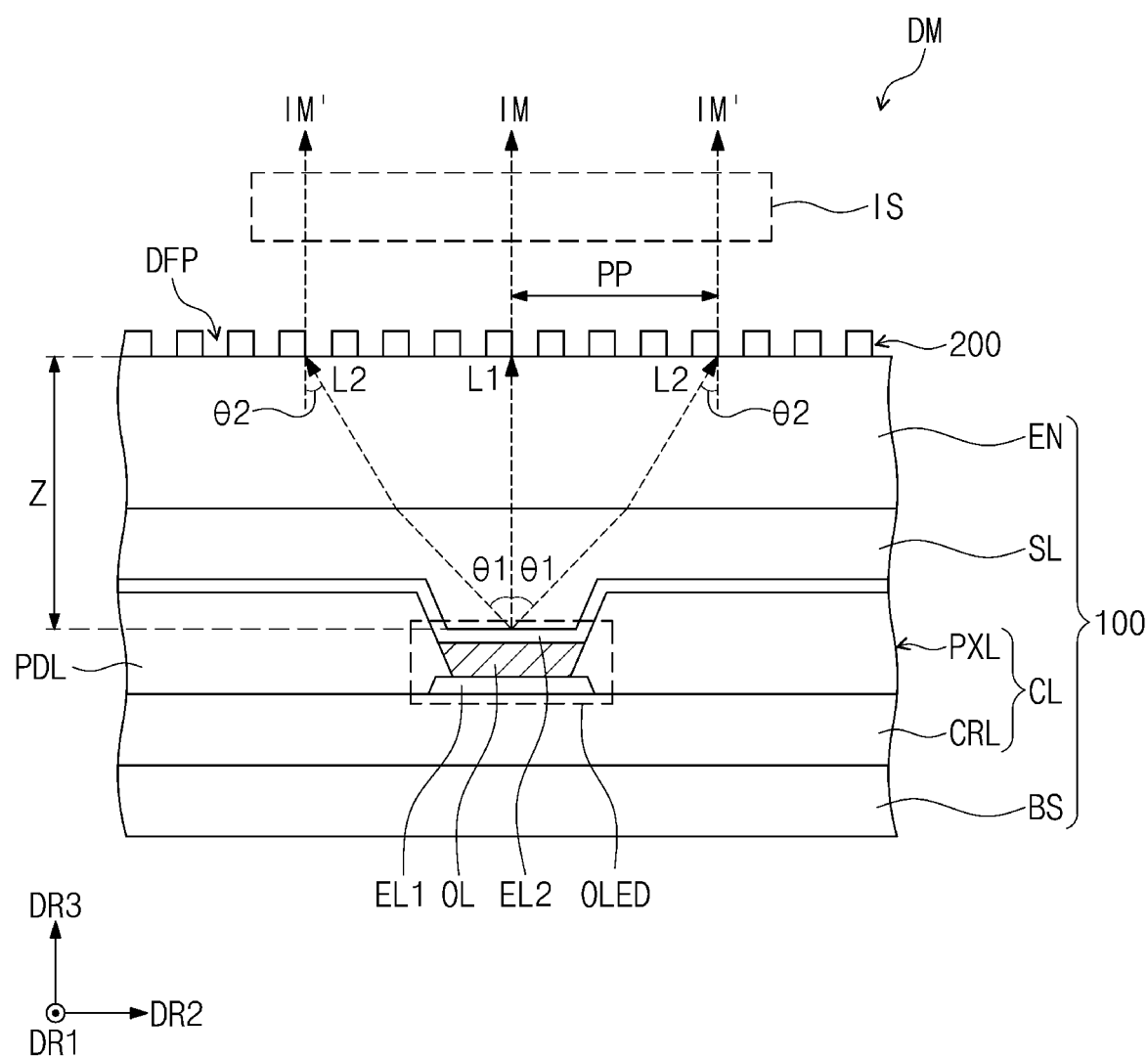
FIG. 5 is an enlarged cross-sectional view of the display module of FIG. 3.

Referring to FIG. 5 together with FIGS. 2 and 3, the display layer CL is disposed above the base layer BS. The display layer CL includes a pixel layer PXL and a circuit layer CRL.

According to an embodiment of the inventive concept, a type of the display panel 100 may be determined according to the configuration of the display layer CL. The display panel 100 may be an organic light emitting display panel, a liquid crystal display panel, an electrophoretic display panel, or an electro-wetting display panel, or may be one of various other display panels capable of displaying images as is well understood by those skilled in the art. In addition, the display panel 100 according to the inventive concept may include various embodiments, but is not limited to one embodiment. In the drawings that will be described below, a case in which the display panel 100 is the organic light emitting display panel will be illustrated as an example.

The circuit layer CRL is disposed on the base layer BS. The circuit layer CRL may include a plurality of thin film transistors for driving the organic light emitting elements OLED and a plurality of signal lines.

The pixel layer PXL is disposed on the circuit layer CRL. The pixel layer PXL includes a plurality of organic light emitting elements OLED and a pixel defining layer PDL partitioning the organic light emitting elements OLED. One organic light emitting element OLED of the pixel layer PXL and at least one thin film transistor of the circuit layer CRL connected to the one organic light emitting element OLED may define one pixel PX. That is, the display panel 100 according to this embodiment includes a plurality of pixels PX.

An encapsulation layer EN is disposed on the display layer CL. The encapsulation layer EN covers the display layer CL to protect the display layer CL against elements from the outside. The encapsulation layer EN may include an inorganic material. For example, the encapsulation layer EN may be provided in the form of a glass substrate.

Although not shown, the display apparatus 1000 may further include a sealing member for sealing the base layer BS and the encapsulation layer EN on the non-display area NDA.

The sub encapsulation layer SL is disposed between the encapsulation layer EN and the display layer CL. That is, the encapsulation layer EN may be spaced apart by a distance (e.g., a predetermined distance) from the display layer CL, and the sub encapsulation layer SL may be located in the space between the encapsulation layer EN and the display layer CL. In this embodiment, the sub encapsulation layer SL may be a filler. For example, the sub encapsulation layer SL may be an inert gas. The sub encapsulation layer SL may prevent foreign substances existing between the encapsulation layer EN and the display layer CL from being diffused.

Although not shown, according to another embodiment of the inventive concept, the sub encapsulation layer SL may be omitted. In this case, the encapsulation layer EN may be disposed on the display layer CL to contact and cover the display layer CL. In this embodiment, the encapsulation layer EN may include a plurality of laminated organic layers and/or inorganic layers. Also, the encapsulation layer EN may serve as a planarization layer that planarizes a top surface of the display layer CL. The encapsulation layer EN according to an embodiment may have various shapes, but is not limited to one embodiment.

According to an embodiment of the inventive concept, the pattern layer 200 may be disposed on the encapsulation layer EN. The pattern layer 200 may, for example, have the same refractive index as the encapsulation layer EN. For example, each of the pattern layer 200 and the encapsulation layer EN may have a refractive index of about 1.4 to about 1.6.

In an embodiment of the inventive concept, the pattern layer 200 may include the same material as the encapsulation layer EN.

The pattern layer 200 may include a plurality of diffraction patterns DFP. The diffraction patterns DFP are arranged in the form of a matrix having a plurality of rows and columns in the first direction DR1 and the second direction DR2 on the pattern layer 200. The diffraction patterns DFP have an interval (e.g., a predetermined interval) a.

In this embodiment, each of the diffraction patterns DFP has a hole shape passing through the pattern layer 200. For example, the pattern layer 200 includes a plurality of holes DFP passing through the pattern layer 200 in the third direction DR3, and the plurality of holes DFP are defined as the diffraction patterns DFP. In this embodiment, each of the diffraction patterns DFP may have a circular shape on the plane.

In this embodiment, the diffraction patterns DFP may diffract at least a portion of light incident on the pattern layer 200 to display the image IMG (see FIG. 1) on the display surface IS. Hereinafter, the diffraction of light will be described in more detail with reference to FIGS. 5-7.

Figure 4:
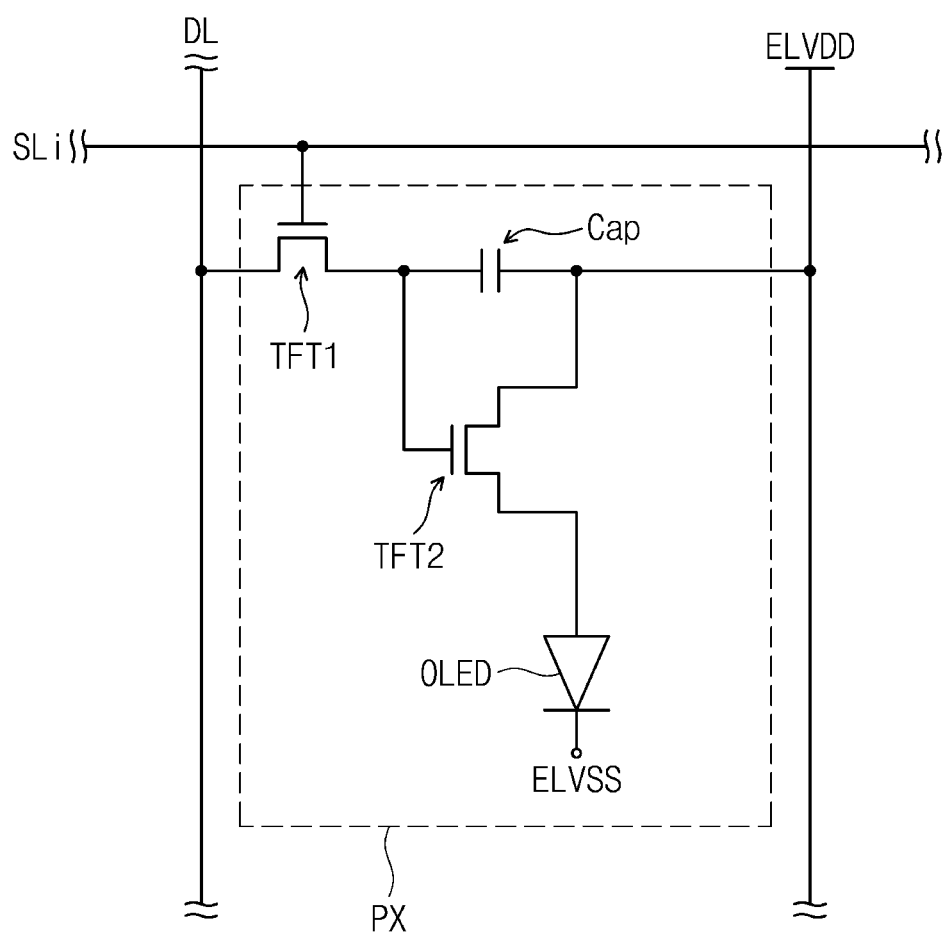
FIG. 4 is an equivalent circuit view of one pixel of FIG. 3.

FIG. 4 is an equivalent circuit view of one pixel of FIG. 3.

Referring to FIG. 4, one pixel PX includes at least one thin film transistor, at least one capacitor, and at least one display element. In this embodiment, the pixel PX includes a first thin film transistor TFT1, a second thin film transistor TFT2, one capacitor Cap, and an organic light emitting element OLED. The first thin film transistor TFT1 includes a control electrode connected to a scan line SLi, an input electrode connected to a data line DL, and an output electrode. The first thin film transistor TFT1 outputs a data signal applied to the data line DL in response to a scan signal applied to the scan line SL.

The capacitor Cap includes a first capacitor electrode connected to the first thin film transistor TFT1 and a second capacitor electrode for receiving the first power voltage ELVDD. The capacitor Cap is charged by an amount corresponding to a difference between a voltage corresponding to the data signal received from the first thin film transistor TFT1 and the first power voltage ELVDD.

The second thin film transistor TFT2 includes a control electrode connected to the output electrode of the first thin film transistor TFT1 and the first capacitor electrode of the capacitor Cap, an input electrode for receiving the first power voltage ELVDD, and an output electrode. The output electrode of the second thin film transistor TFT2 is connected to the organic light emitting element OLED.

The second thin film transistor TFT2 controls driving current flowing through the organic light emitting element OLED to correspond to a charge amount stored in the capacitor Cap. A turn-on time of the second thin film transistor TFT2 is determined according to an amount of charges charged in the capacitor Cap. The output electrode of the second thin film transistor TFT2 supplies a voltage having a level less than that of the first power voltage ELVDD to the organic light emitting element OLED.

The organic light emitting element OLED includes a first electrode EL1 (e.g., see FIG. 5) connected to the second thin film transistor TFT2 and a second electrode EL2 for receiving a second power voltage ELVSS. The organic light emitting element OLED may include a light emitting layer OL disposed between the first electrode EL1 and the second electrode EL2.

The organic light emitting element OLED emits light during a turn-on period of the second thin film transistor TFT2. The light generated in the organic light emitting element OLED may have a color that is determined by a material that forms the light emitting pattern (e.g., the organic light emitting element OLED). For example, the color of the light generated in the organic light emitting element OLED may have one of a red color, a green color, a blue color, and a white color. The organic light emitting element OLED substantially defines emission areas PXA (see FIG. 7) on the display panel 100.

Figure 6:
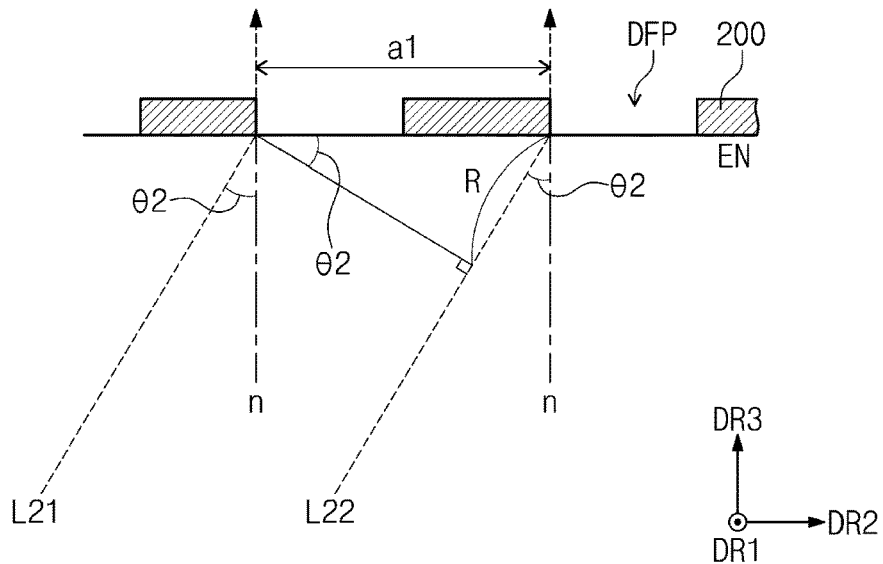
FIG. 6 is a schematic view illustrating a state in which a second light of FIG. 5 is diffracted.

FIG. 5 is an enlarged cross-sectional view of the display module of FIG. 3, and FIG. 6 is a schematic view illustrating a state in which second light of FIG. 5 is diffracted. For convenience of description, only one cross-section of the display module DM, which is cut along a line parallel to the second direction DR2 is illustrated in FIGS. 5 and 6. According to an embodiment of the inventive concept, the display module DM that will be described later may have the same configuration as a cross-section of the display module DM, which is cut along a line parallel to the first direction DR1.

Referring to FIGS. 5, 6, the organic light emitting element OLED according to an embodiment of the inventive concept generates a first light L1 and a second light L2. The first light L1 and the second light L2 are emitted from the organic light emitting element OLED, and travel upward along the third direction DR3 perpendicular to the display surface IS. The first light L1 and the second light L2 may be defined as a front light. The first light L1 passes through the sub encapsulation layer SL, the encapsulation layer EN, and the diffraction pattern DFP to display a pixel unit image IM on the display surface IS.

The light except for the first light L1 and the second light L2 emitted from the organic light emitting element OLED may be defined as a side light. For convenience of description, only the first light L1 and the second light L2, defined as light emitted from the organic light emitting element OLED in a direction that is angled at a first angle 81 with respect to the first light L1, are illustrated in FIG. 5.

The second light L2 may pass through the sub encapsulation layer SL and the encapsulation layer EN in the direction that is angled at the first angle 81 with respect to the first light L1. The second light L2 may be refracted by an interface between the sub encapsulation layer SL and the encapsulation layer EN. The refracted second light L2 may be angled at a second angle 82 with respect to the first light L1.

The second light L2 refracted at the second angle 82 is incident on the encapsulation layer EN. The second light L2 may pass through the encapsulation layer EN and be incident on the diffraction patterns DFP. The incident second light L2 may be diffracted by the diffraction patterns DFP.

According to an embodiment of the inventive concept, the diffraction patterns DFP having the interval a1 (e.g., the predetermined interval a1) may diffract the second light L2, which is incident at the second angle 82 with respect to the first light L1, of the incident light to display a duplicate unit image IM' on the display surface IS. That is, the second light L2 may be incident on the diffraction patterns DFP at the second angle 82 so as to display the duplicate unit image IM'. According to an embodiment of the inventive concept, the interval a1 of the diffraction patterns DFP may be about 5 um to about 7 um.

According to this embodiment, the second light L2 emitted from the organic light emitting element OLED at the first angle 81 with respect to the first light L1 is refracted by the intermediate members SL and EN and incident to the diffraction patterns DFP at the second angle 82 with respect to the first light L1. Although the intermediate members SL and EN include the sub encapsulation layer SL and the encapsulation layer EN in this embodiment, embodiments of the inventive concept are not limited to the number and kind of intermediate members. For example, in another embodiment of the inventive concept, separate members may be provided between the pixel layer PXL and the pattern layer 200 to adjust a length of a light path through which the light emitted from the organic light emitting element OLED travels to the diffraction pattern DFP within a range satisfying the diffraction conditions.

As described above, the diffraction patterns DFP diffract the second light L2 to display one or more duplicate unit images IM' on the display surface IS.

According to an embodiment of the inventive concept, the second light L2 may include a first sub light L21 and a second sub light L22. Each of the first sub light L21 and the second sub light L22 is angled at the second angle 82 with respect to the first light L1, and the first sub light L21 and the second sub light L22 are incident on the diffraction patterns DFP differently (e.g., different from each other). For example, there may be a difference in the light paths of the first sub light L21 and the second sub light L22. The difference in light paths may be defined as a first distance R.

According to this embodiment, the first sub light L21 and the second sub light L22 may be diffracted by the diffraction patterns DFP to constructively interfere with each other. For example, a phase difference may occur between the first sub light L21 and the second sub light L22. The phase difference may be equal to a wavelength λ of the second light L2. Thus, the first distance R may be proportional to the wavelength λ of the second light L2. The constructively interfering first sub light L21 and second sub light L22 display the duplicate unit image IM' on the display surface IS.

Figure 7:
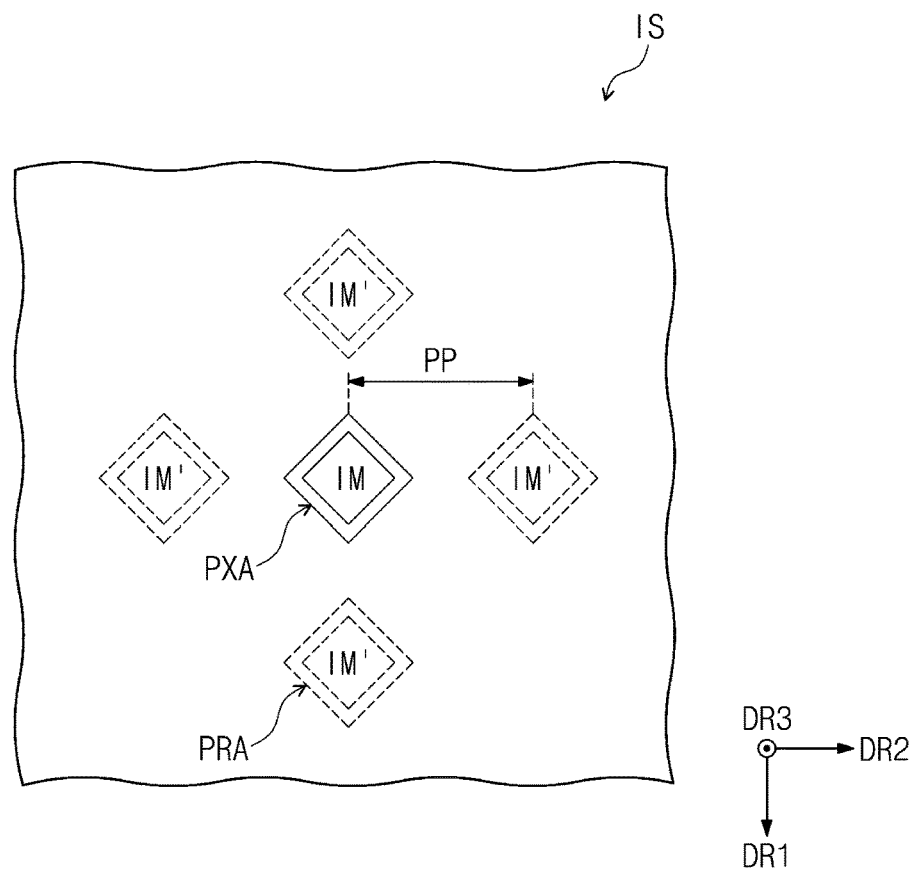
FIG. 7 is a plan view of duplicate unit images displayed on a display surface by the diffracted light.

FIG. 7 is a plan view of duplicate unit images displayed on a display surface by the diffracted light. For convenience of description, only one emission area PXA of the plurality of emission areas PXA is illustrated in FIG. 7.

Referring to FIG. 7, the display surface IS according to an embodiment of the inventive concept includes a plurality of emission areas PXA and a plurality of duplicate areas PRA. The plurality of duplicate areas PRA are arranged around (e.g., to surround) one emission area PXA. In this embodiment, the duplicate areas PRA may be defined on both sides of the one emission area PXA in the first direction DR1 and the second direction DR2. Each of the emission areas PXA may have the same shape as each of the duplicate areas PRA. Although each of the emission areas PXA and the duplicate areas PRA has a diamond shape in FIG. 7, the embodiment of the inventive concept is not specifically limited to the shape.

The emission areas PXA and the duplicate areas PRA are arranged to be spaced apart from each other. An interval between one emission area PXA and one duplicate area PRA adjacent to the corresponding emission area PXA is referred to as a duplicate interval PP. The duplicate interval PP is a distance between a center of the one emission area PXA and a center of the one duplicate area PRA.

According to this embodiment, the first light L1 emitted from the above-described organic light emitting element OLED may pass through the intermediate members SL and EN to display the pixel unit image IM on the emission area PXA of the display surface IS. The pixel unit image IM has a shape corresponding to a planar shape of the organic light emitting element OLED. Also, the second light L2 emitted from the organic light emitting element OLED may pass through the intermediate members SL and EN to display the duplicate unit image IM' on the duplicate area PRA of the display surface IS. The duplicate unit image IM' may be the same shape as the pixel unit image IM. The image IMG (see FIG. 1) displayed by the display module DM may provide a mixed shape of the pixel unit images IM and the duplicate unit images IM' to the user.

According to an embodiment of the inventive concept, the plurality of unit images IM and IM' may be displayed on the display surface IS by using the light emitted from the one organic light emitting element OLED. That is, the unit image provided from the one organic light emitting element OLED may be duplicated one or more times.

Unlike this embodiment of the inventive concept, when the display apparatus 1000 does not include the diffraction patterns DFP for displaying the duplicate unit image IM', the non-emission area defined as areas occupied by the pixel defining layer PDL (see FIG. 5) between the emission areas PXA on the existing display surface IS may be visible from the outside. The phenomenon that the visible non-emission area is visible is referred to as a screen door effect (SDE) phenomenon. For example, the SDE phenomenon may be more pronounced when the display apparatus 1000 is enlarged and is applied to a head mount device (HMD) in which the display surface IS is enlarged and provided to the user. However, according to an embodiment of the inventive concept, as the duplicate areas PRA on which a separate unit image is displayed are formed on the non-emission area, the phenomenon in which the non-emission area is visible from the outside by the user may be prevented from occurring. That is, the display apparatus 1000 may have improved display quality.

According to an embodiment of the inventive concept, the diffraction patterns DFP may include a plurality of diffraction patterns having different widths. Hereinafter, this will be described below with reference to FIGS. 8A and 11.

Figure 8A:
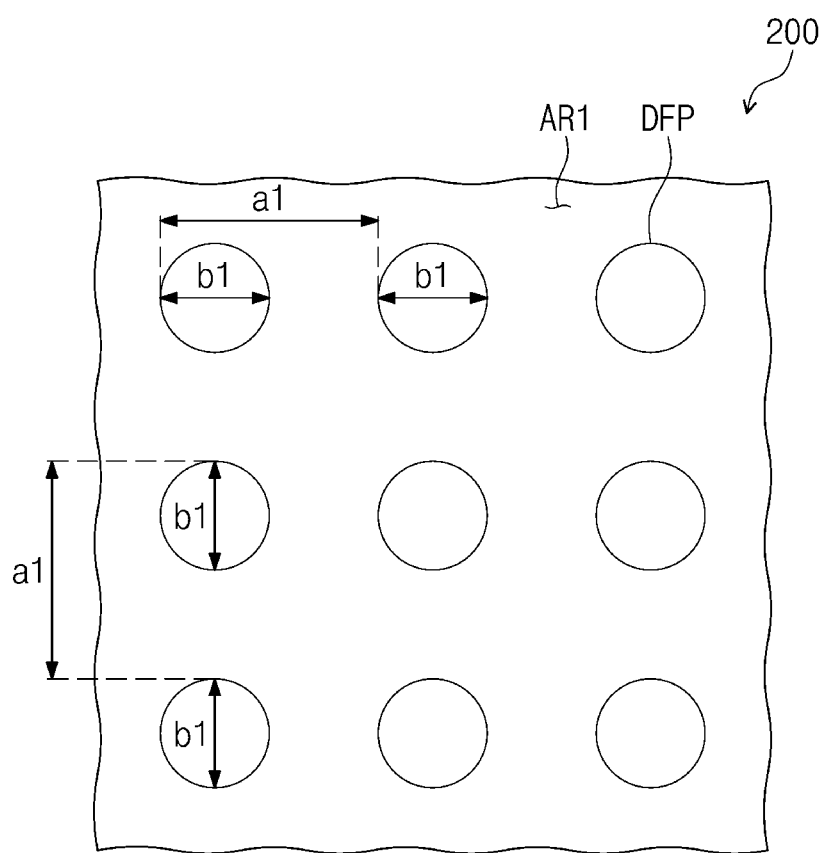
FIGS. 8A and 8B are plan views illustrating a comparative example of a pattern layer.
Figure 8B:
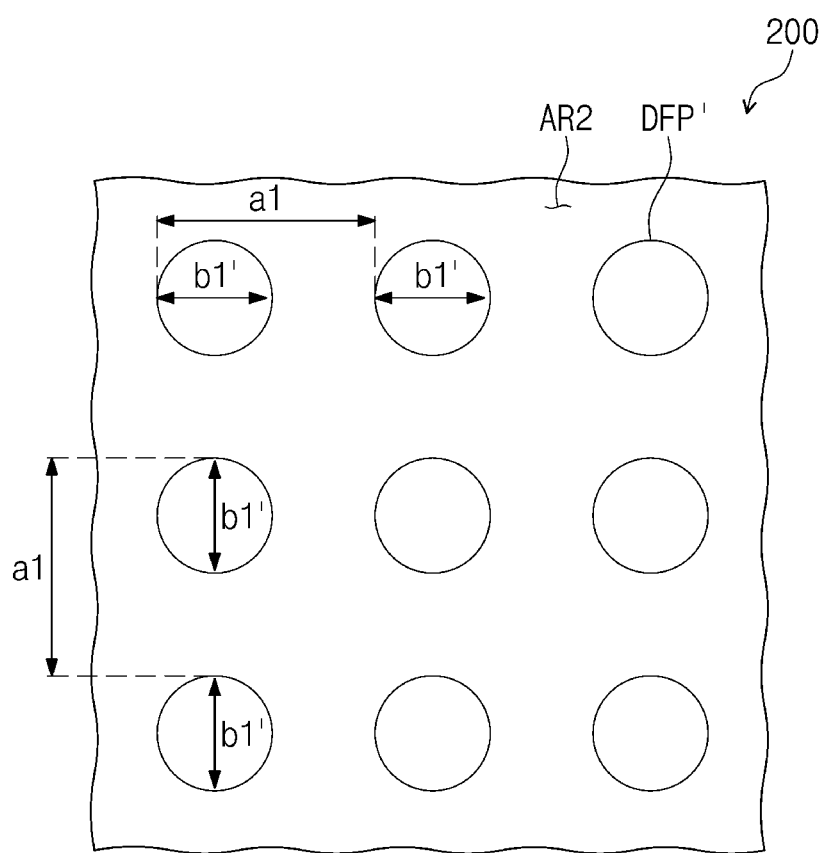

FIGS. 8A and 8B are plan views illustrating a comparative example of the pattern layer, and FIG. 9 is a graph illustrating a relative relationship between luminance and an SDE index of the display apparatus according to a width of each of patterns of FIGS. 8A and 8B.

Referring to FIGS. 7, 8A, 8B and 9, luminance of the image IMG (see FIG. 1) displayed on the display surface IS and an SDE index appearing on the display surface IS may vary by the pixel unit images IM and the duplicate unit images IM' according to the width of each of the diffraction patterns DFP. The SDE index is an index indicating a degree to which the SDE phenomenon appears. The more the SDE index decreases on the display surface IS, the more the non-emission area described above may be visible by the user.

In the graph of FIG. 9, an x-axis represents a size of widths b1 and b1' of the diffraction pattern DFP, or a ratio of the widths b1 and b1' to an interval a1. Here, the diffraction patterns DFP and DFP' may have a constant interval a1. For example, the interval a1 may be about 3 um to about 9 um, and a radio of the widths b1 and b1' to the interval a1 may be in range of about 5% to 95%.

In the graph of FIG. 9, a y-axis represents luminance A and an SDE index B of the image IMG (see FIG. 1). The graph representing the luminance of the image IMG (see FIG. 1) is illustrated as a plot of A, and the SDE index is illustrated as a plot of B.

Experimentally, the luminance A and the SDE index B according to the width of each of the diffraction patterns DFP may be different from each other in the waveform graph. The luminance A according to the width of each of the diffraction patterns DFP may have an opposite relation with the SDE index B according to the width of each of the diffraction patterns DFP. For example, when the diffraction patterns DFP have a specific width, the luminance A may have a maximum value, and the SDE index B may have a minimum value.

Referring to FIGS. 8A and 8B, in the process of forming the diffraction patterns DFP and DFP' on the encapsulation layer EN (see FIGS. 4 and 5), the diffraction patterns DFP and DFP' may have different widths in each area.

For example, the diffraction patterns DFP and DFP' may have a first width b1 or a first error width b1'. For example, the first error width b1' may be greater than the first width b1. An area on the pattern layer 200 on which the diffraction pattern DFP having the first width b1 is formed may be defined as the first area AR1. An area on the pattern layer 200 on which the diffraction pattern DFP' having the first error width b1' is formed may be defined as the second area AR2. A difference between the first width b1 and the first error width b1' may be equal to or greater than about 0.3 um.

Each of the first area AR1 and the second area AR2 is not limited in number, and may be located on the pattern layer 200. The diffraction patterns DFP' disposed on the second area AR2 may be provided by a process errors in the process of forming the diffraction patterns DFP on the encapsulation layer EN. For example, when the diffraction patterns DFP are formed by a photolithography process, an error in the process may be a difference in etching amount, a difference in exposure amount, or a difference in thickness between the first region AR1 and the second region AR2.

Referring to FIGS. 8A, 8B and 9, because the diffraction patterns DFP and DFP' have widths b1 and b1' that are different from each other, the luminance A and the SDE index B of the first area AR1 may be different from the luminance A and the SDE index B of the second area AR2. In this case, the image IMG (see FIG. 1) displayed on the display surface IS may be differently visible according to the luminance and the SDE index. That is, the display apparatus 1000 may be deteriorated in display quality. For example, the first area AR1 on which the diffraction pattern DFP having the first width b1 is formed may have a value of $x_1$ in the x-axis and a luminance value of $y_1$ in the y-axis. The second area AR2 on which the diffraction pattern DFP' having the first error width b1' is formed may have a value of $x_1'$ in the x-axis and a luminance value of $y_1'$ in the y-axis. A difference $dy_1$ in luminance between the first area AR1 and the second area AR2 may be $y_1$-$y_1'$. In the above example, the luminance difference $dy_1$ has a negative number.

In the above example, although only the difference in luminance A is explained, the SDE index B may also have a difference between the first area AR1 and the second area AR2. Here, because the SDE index B has a value opposite to the luminance A, the difference value may have a positive value.

Figure 10A:
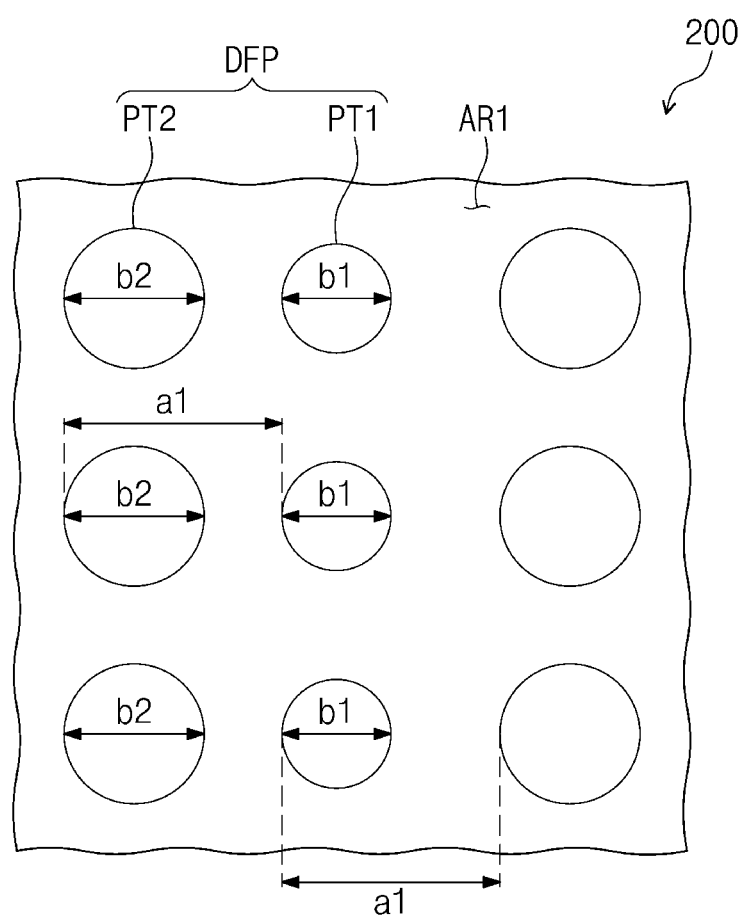
FIGS. 10A and 10B are plan views of the pattern layer according to an embodiment of the inventive concept.
Figure 10B:
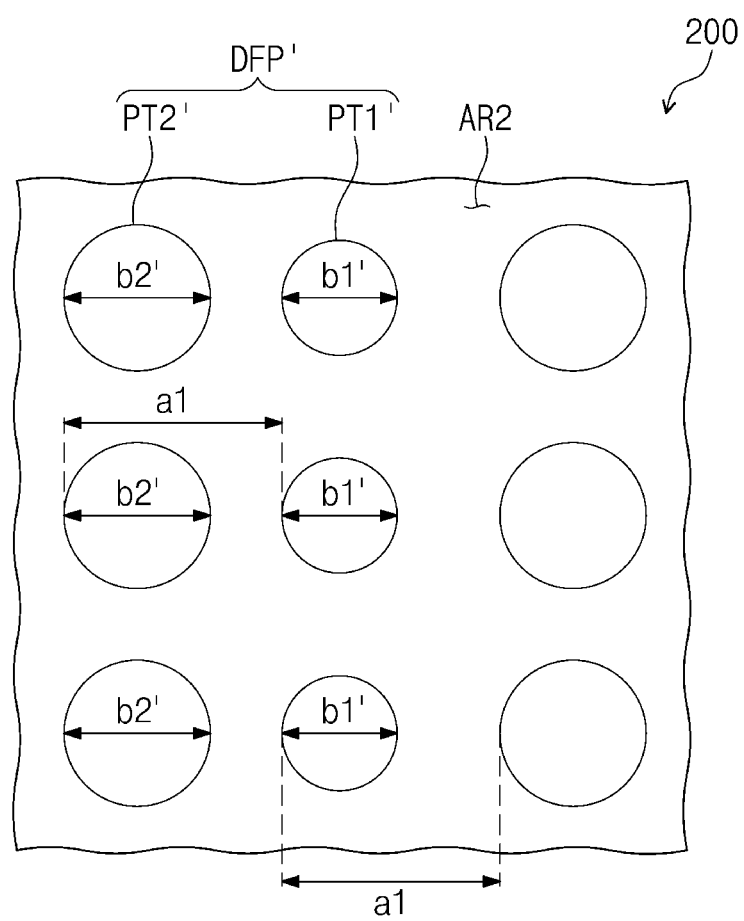
Figure 11:
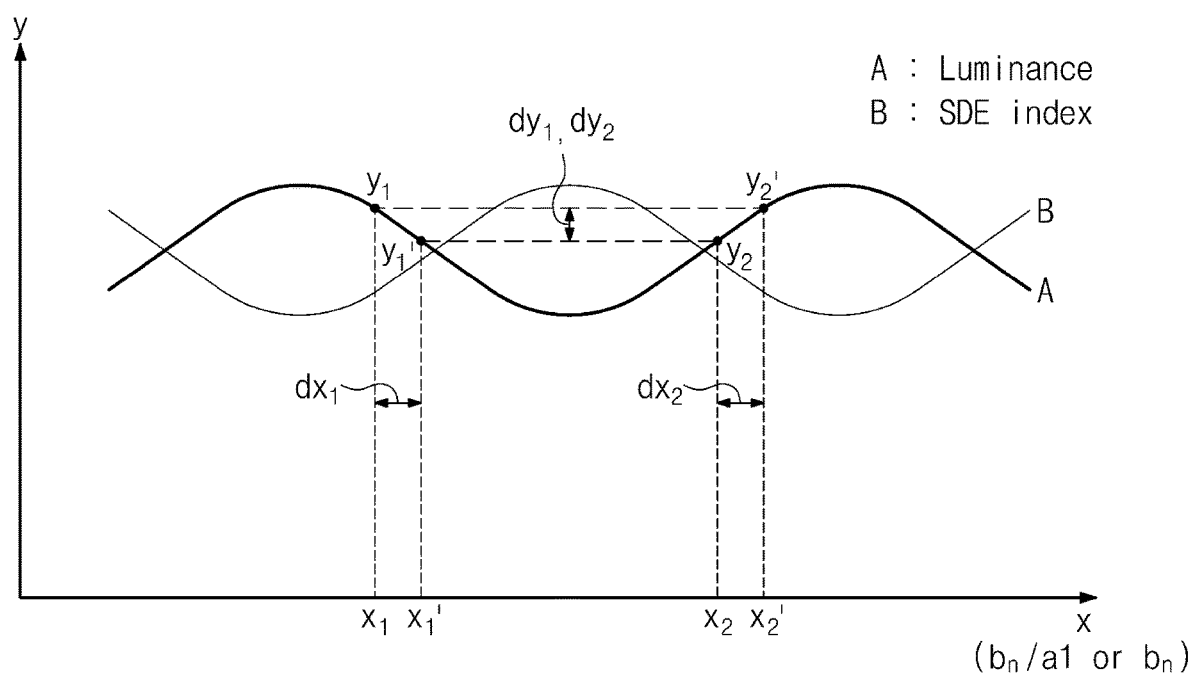
FIG. 11 is a graph illustrating a relationship between luminance and an SDE index of the display apparatus according to a width of each of patterns of FIGS. 10A and 10B.

FIGS. 10A and 10B are plan views of the pattern layer according to an embodiment of the inventive concept, and FIG. 11 is a graph illustrating a relationship between luminance and an SDE index of the display apparatus according to a width of each of patterns of FIGS. 10A and 10B.

Referring to FIGS. 10A and 10B, the diffraction patterns DFP and DFP' of the first area AR1 and the second area AR2 according to an embodiment of the inventive concept may include a plurality of patterns PT1, PT2, PT1', and PT2'.

For example, the diffraction patterns DFP disposed on the first area AR1 include first patterns PT1 and second patterns PT2. In this embodiment, each of the first patterns PT1 may be similar to each of the second patterns PT2. Each of the first patterns PT1 may have the same configuration as each of the diffraction patterns DFP of FIG. 8A. That is, each of the first patterns PT1 has a first width b1. Each of the second patterns PT2 has a second width b2. In this embodiment, the second width b2 may be greater than the first width b1. Although not shown, according to this embodiment, a ratio of the number of second patterns PT2 to the number of first patterns PT1 on the pattern layer 200 may be about 20% to about 80%. In another embodiment, the number of first patterns PT1 on the pattern layer 200 may be equal to the number of second patterns PT2. In various embodiments of the inventive concept, the first patterns PT1 and the second patterns PT2 may correspond to a pixel layout of the display apparatus (e.g., the display apparatus 100 described above). For example, in various embodiments of the inventive concept, the display apparatus may have a pixel layout that includes pixels having differing sizes and shapes, and the first patterns PT1 and second patterns PT2 may correspond to the sizes and shapes of the pixel layout of the display apparatus. For example, in various embodiments of the inventive concept, a green pixel of the display apparatus may have a larger size than a red or blue pixel of the display apparatus. In other embodiments of the inventive concept, the blue pixels may be larger than the red and green pixels or the red pixels may be larger than the green and blue pixels.

In this embodiment, the first patterns PT1 and the second patterns PT2 are arranged on the pattern layer 200 at a constant interval a. Thus, at least a portion of light incident on the pattern layer 200 may be constructively interfered by the first patterns PT1 and the second patterns PT2.

The first patterns PT1 form a plurality of first columns on the pattern layer 200. The second patterns PT2 provide a plurality of second columns. The first columns may be parallel to the second columns. The first columns and the second columns are alternately arranged. One first pattern PT1 of the first columns may form one row with one second pattern PT2 of each of the second columns adjacent to each other, and the row may be perpendicular to the first column and the second column on the plane. According to this embodiment, a virtual line connecting a center of each of the first patterns PT1 to a center of each of the second patterns PT2 may be parallel to a direction of the row.

That is, the diffraction patterns DFP may form a plurality of rows on the pattern layer 200 perpendicular to the first and second columns, and each of the rows may have a form in which the first patterns PT1 and the second patterns PT2 are alternately arranged.

However, this is merely an example of the arrangement relationship of the first and second patterns PT1 and PT2. According to another embodiment of the inventive concept, the first and second patterns PT1 and PT2 may be arranged in various shapes. For example, according to another embodiment of the inventive concept, a plurality of first groups including the plurality of first columns may be alternately arranged with a plurality of second groups including the plurality of columns.

Similarly, the diffraction patterns DFP' arranged on the second area AR2 include first patterns PT1' and second patterns PT2'. Each of the first patterns PT1' has a first error width b1', and each of the second patterns PT2' has a second error width b2'. For example, the second error width b2' may be greater than the second width b2. The first patterns PT1' and the second patterns PT2' have a constant interval a1.

According to an embodiment of the inventive concept, the pattern layer 200 may include the plurality of diffraction patterns DFP having widths b1 and b2 that are different from each other. Thus, in the process of forming the diffraction patterns DFP, even though the diffraction patterns DFP have widths that are different from each other due to the process error, the phenomenon in which the luminance or the SED index is differently perceived may be reduced.

For example, referring to FIG. 11, the first area AR1 on which the first pattern PT1 having the first width b1 and the second pattern PT2 having the second width b2 are arranged may have the values of $x_1$ and $x_2$ in the x-axis and the luminance values of $y_1$ and $y_2$ in the y-axis.

The second area AR2 on which the first pattern PT1' having the first error width b1' and the second pattern PT2' having the second error width b2' are arranged may have the values of $x_1'$ and $x_2'$ in the x-axis and the luminance values of $y_1'$ and $y_2'$ in the y-axis.

According to this embodiment, a first luminance difference $dy_1$ generated between the first area AR1 and the second area AR2 by the first patterns PT1 and PT1' may be $y_1$-$y_1'$, and a second luminance difference dye generated between the first area AR1 and the second area AR2 by the second patterns PT2 and PT2' may be $y_2$-$y_2'$. In this example, the second luminance difference $dy_2$ is the same as the first luminance difference $dy_1$ and has a sign (e.g., positive or negative) that is different from that of the first luminance difference $dy_1$. That is, the second width b2 of the second pattern PT2 may be set so that a product of a rate of change of the value of $y_2$ and the value of $y_2'$ value and a rate of change of the value of $y_1$ and the value of value has a negative number. According to this embodiment, in the graph of FIG. 11, the $x_2$ value representing the second width b2 may be set so that the $y_2$ value is the same as the $y_1'$ value, and the $y_2'$ value is the same the $y_1$ value. In the above example, the second luminance difference $dy_2$ has a positive number.

As described above, as the diffraction patterns DFP include the first and second patterns PT1 and PT2 having different widths b1 and b2, even though the first luminance difference $dy_1$ is generated due to the process error generated by the process of forming the first patterns PT1, the second luminance difference $dy_2$ generated by the process of forming the second patterns PT2 may compensate the first luminance difference $dy_1$. That is, because each of the first patterns PT1 and the second patterns PT2 may vary in width due to the process error, the phenomenon in which the display quality is deteriorated may be reduced.

Although the luminance difference compensation according to the inventive concept is illustrated with reference to the luminance value A in FIG. 11, the SDE index B may also be compensated (e.g., equally compensated). For example, because the diffraction patterns DFP include the first and second patterns PT1 and PT2 having different widths b1 and b2, even if an SDE index difference is generated due to process errors in the process of forming the first patterns PT1, the error may be compensated by the SED index difference generated in the process of forming the second patterns PT2.

Figure 12A:
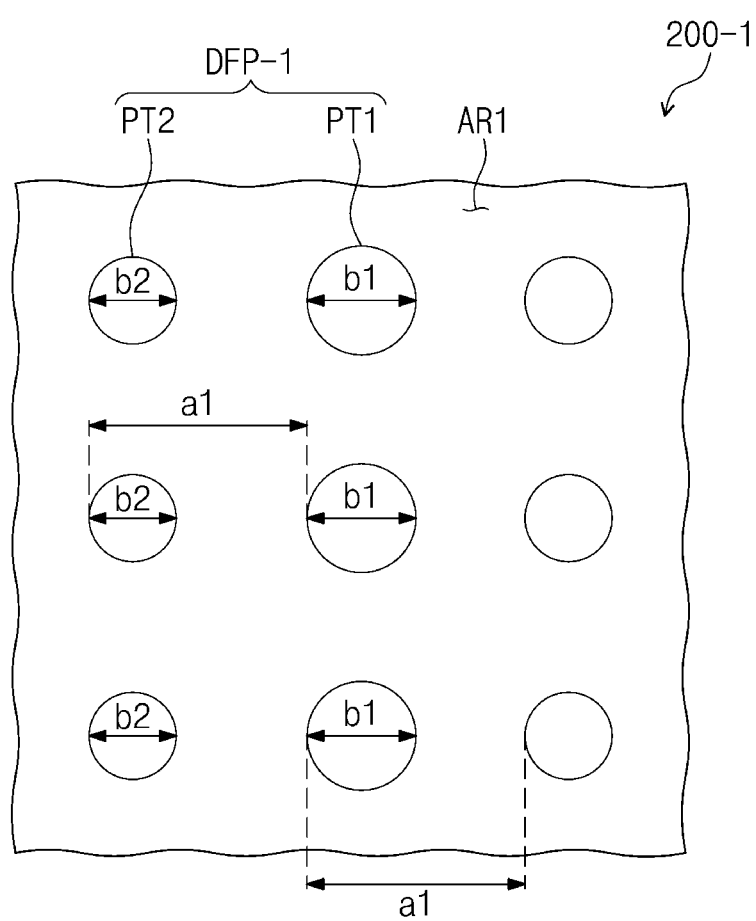
FIGS. 12A and 12B are plan views of a pattern layer according to another embodiment of the inventive concept.
Figure 12B:
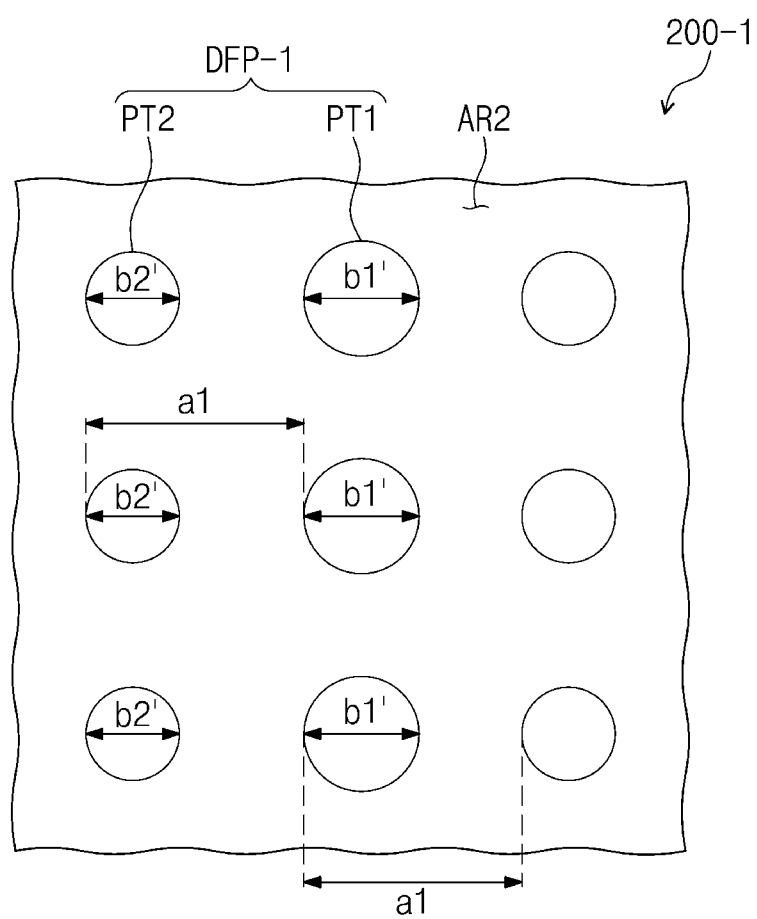
Figure 13:
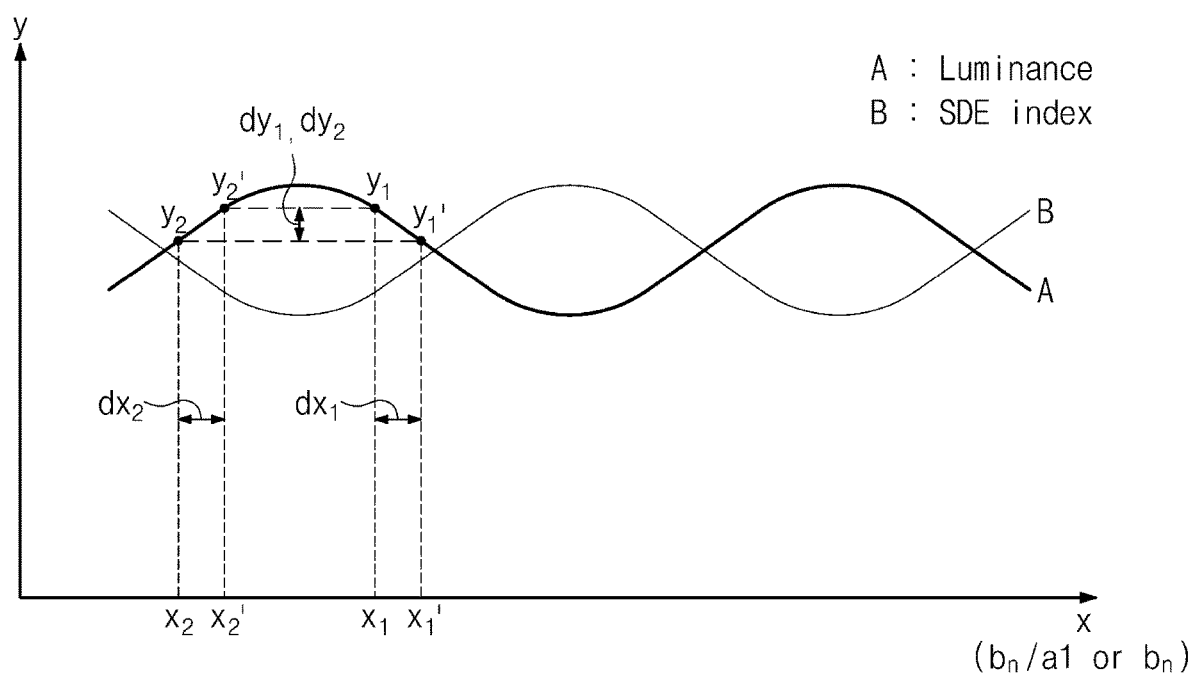
FIG. 13 is a graph illustrating a relationship between luminance and an SDE index of a display apparatus according to a width of each of patterns of FIGS. 12A and 12B.

FIGS. 12A and 12B are plan views of a pattern layer according to another embodiment of the inventive concept, and FIG. 13 is a graph illustrating a relationship between luminance and an SDE index of a display apparatus according to a width of each of patterns of FIGS. 12A and 12B.

For convenience of description, differences between this embodiment and the previous embodiments will be primarily described, and omitted descriptions may be derived from the previous embodiments. Also, the same reference symbols have been given to same components, and duplicated descriptions with respect to the previously described components may be omitted.

Referring to FIGS. 12A, 12b, and 13, second patterns PT2 of diffraction patterns DFP-1, according to another embodiment of the inventive concept, has a width less than that of each of first patterns PT1. For example, each of the first patterns PT1 has a first width b1, and each of the second patterns PT2 has a second width b2. The second width b2 has a value that is less than that of the first width b1.

In the graph depicted in FIG. 13, the value of $y_1$-$y_1'$ indicating the first luminance difference $dy_1$ has a negative value, and the value of $y_2$-$y_2'$ indicating the second luminance difference dye has a positive value. The values $x_2$ and $x_2'$ in FIG. 13 are less than those of $x_2$ and $x_2'$ in FIG. 11.

Figure 14:
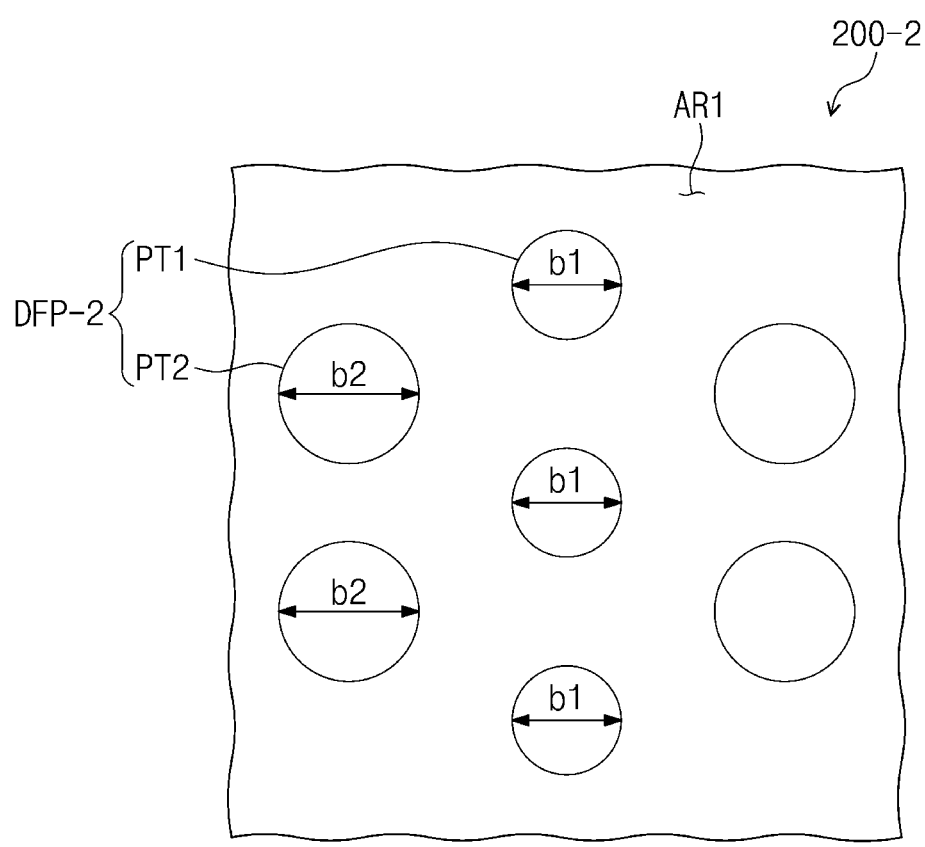
FIG. 14 is a plan view of a pattern layer according to another embodiment of the inventive concept.

FIG. 14 is a plan view of a pattern layer according to another embodiment of the inventive concept.

For convenience of description, differences between this embodiment and the previous embodiments will be primarily described, and omitted descriptions may be derived from the previous embodiments. Same reference symbols have been given to same components, and duplicated descriptions with respect to the same components may be omitted.

Referring to FIG. 14, diffraction patterns DFP-2 according to another embodiment of the inventive concept include first patterns PT1 and second patterns PT2. The first patterns PT1 form a plurality of first columns. The second patterns PT2 form a plurality of second columns. The first columns may be parallel to the second columns. The first columns and the second columns are alternately arranged.

The first patterns PT1 form a plurality of first rows. The second patterns PT2 form a plurality of second rows. The first rows may be parallel to the second rows. The first rows and the second rows are alternately arranged. According to this embodiment, a virtual line connecting a center of each of the first patterns PT1 to a center of each of the second patterns PT2 may not be parallel to a direction of the row (e.g., may be along a diagonal direction).

According to this embodiment, duplicate areas PRA (e.g., see FIG. 7) defined on the above-described display surface IS (e.g., see FIG. 7) may be changed in position. For example, the emission areas PXA (e.g., see FIG. 7) and the duplicate areas PRA (e.g., see FIG. 7) may have a hexagonally arranged shape. For example, the plurality of duplicate areas PRA defined around (e.g., to surround) one emission area PXA may be arranged in the hexagonal shape.

Figure 15:
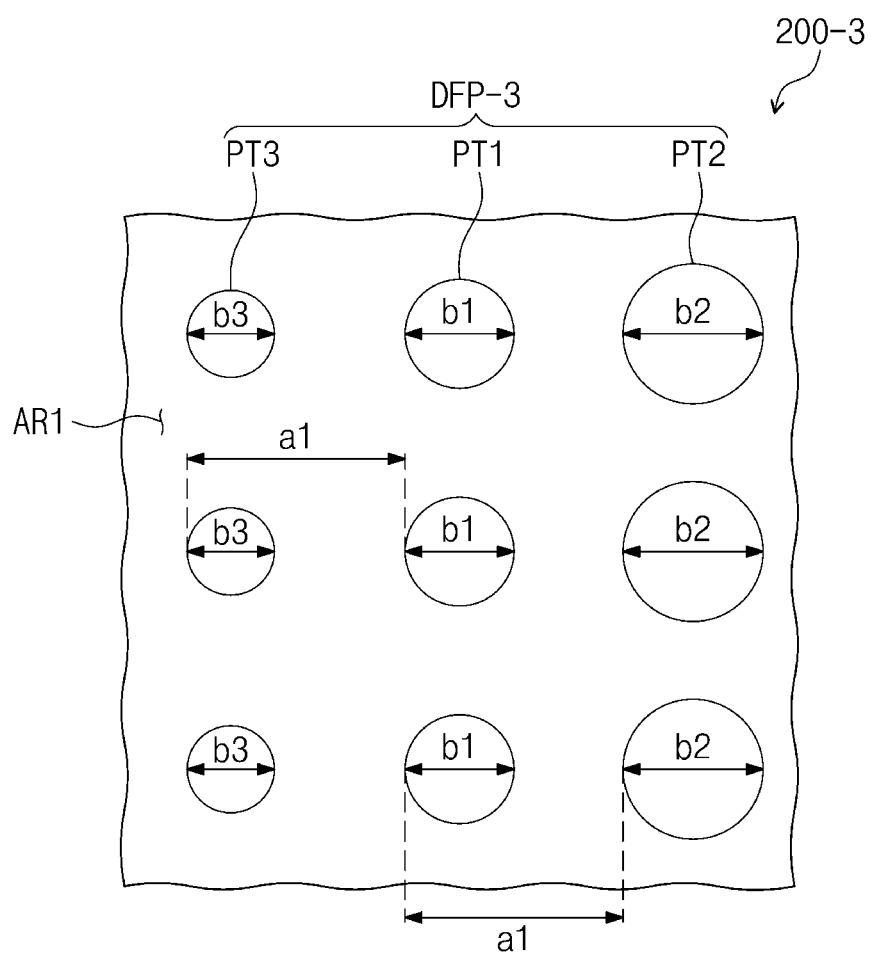
FIG. 15 is a plan view of a pattern layer according to another embodiment of the inventive concept.

FIG. 15 is a plan view of a pattern layer according to another embodiment of the inventive concept.

For convenience of description, differences between this embodiment and the previous embodiments will primarily be described, and omitted descriptions may be derived from the previous embodiments. Same reference symbols are given to same components, and duplicated descriptions with respect to the previously described components may be omitted.

Referring to FIG. 15, diffraction patterns DFP-3 according to another embodiment of the inventive concept further include third patterns PT3. Each of the third patterns PT3 has a third width b3. The third width b3 may be less than the first width b1.

The first patterns PT1 to the third patterns PT3 are alternately arranged on a pattern layer 200-3. The first patterns PT1 and the second patterns PT2 are spaced apart by an interval (e.g., a constant interval) a1.

In this embodiment, the third width b3 may be less than the first width b1. In another embodiment, the third width b3 may be greater than the second width b2.

Figure 16:
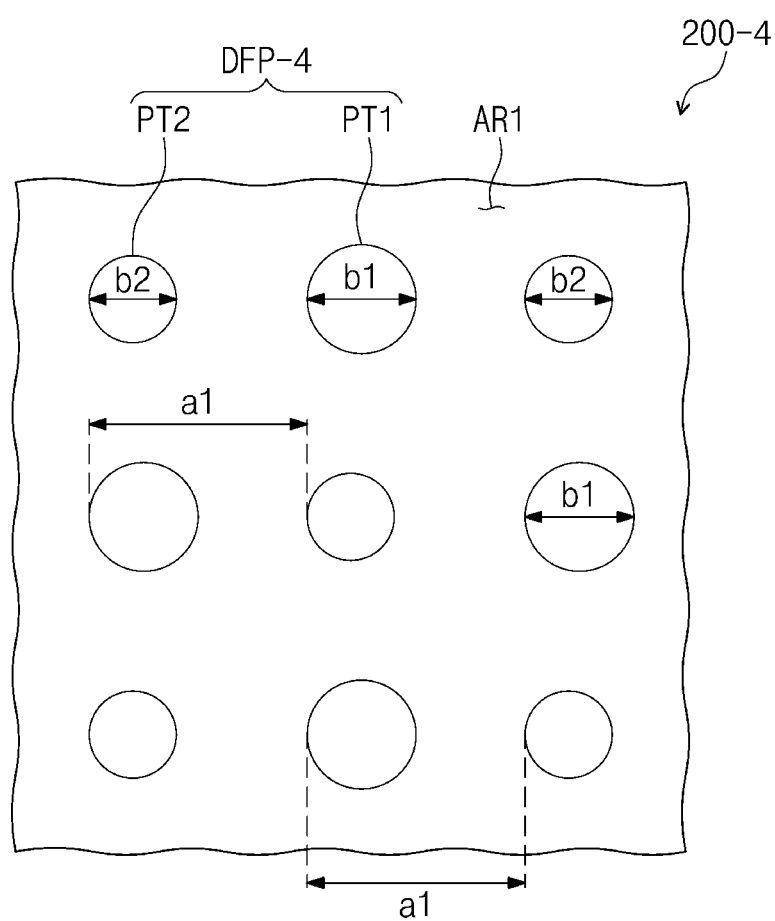
FIG. 16 is a plan view of a pattern layer according to another embodiment of the inventive concept.

FIG. 16 is a plan view of a pattern layer according to another embodiment of the inventive concept.

For convenience of description, differences between this embodiment and the previous embodiments will be primarily described, and omitted descriptions may be derived from the previous embodiments. Same reference symbols may be given to same components, and duplicated descriptions with respect to the previously described components may be omitted.

Referring to FIG. 16, diffraction patterns DFP-4 according to another embodiment of the inventive concept are arranged in the form of a plurality of rows and columns on a pattern layer 200-4. Each of the plurality of columns has a shape in which the first patterns PT1 and the second patterns PT2 are alternately arranged. Each of the plurality of rows has a shape in which the first patterns PT1 and the second patterns PT2 are alternately arranged. According to this embodiment, a virtual line connecting a center of each of the first patterns PT1 to a center of each of the second patterns PT2 may be parallel to a direction of the row or column.

Figure 17:
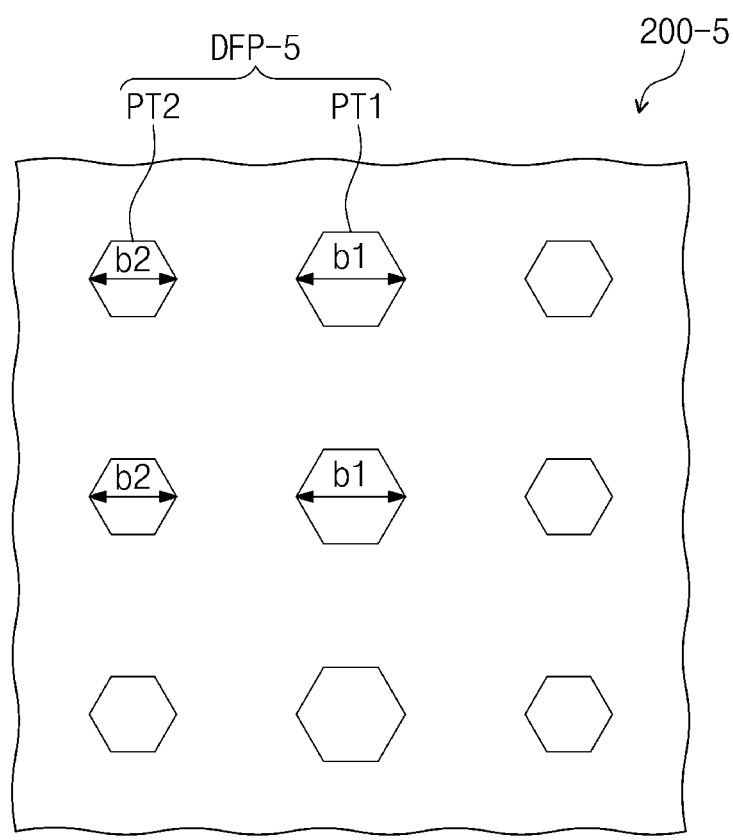
FIG. 17 is a plan view of a pattern layer according to another embodiment of the inventive concept.

FIG. 17 is a plan view of a pattern layer according to another embodiment of the inventive concept.

For convenience of description, differences between this embodiment and the previous embodiments will be primarily described, and omitted descriptions may be derived from the previous embodiments. Same reference symbols may be given to same components, and duplicated descriptions with respect to the previously described components may be omitted.

Referring to FIG. 17, each of diffraction patterns DFP-5 according to another embodiment of the inventive concept may have a hexagonal shape. However, the shape of each of the diffraction patterns DFP-5 is merely an example. According to another embodiment of the inventive concept, each of the diffraction patterns DFP-5 may have a polygonal shape such as a triangular shape and a rectangular shape, or a mixture of multiple shapes.

Figure 18:
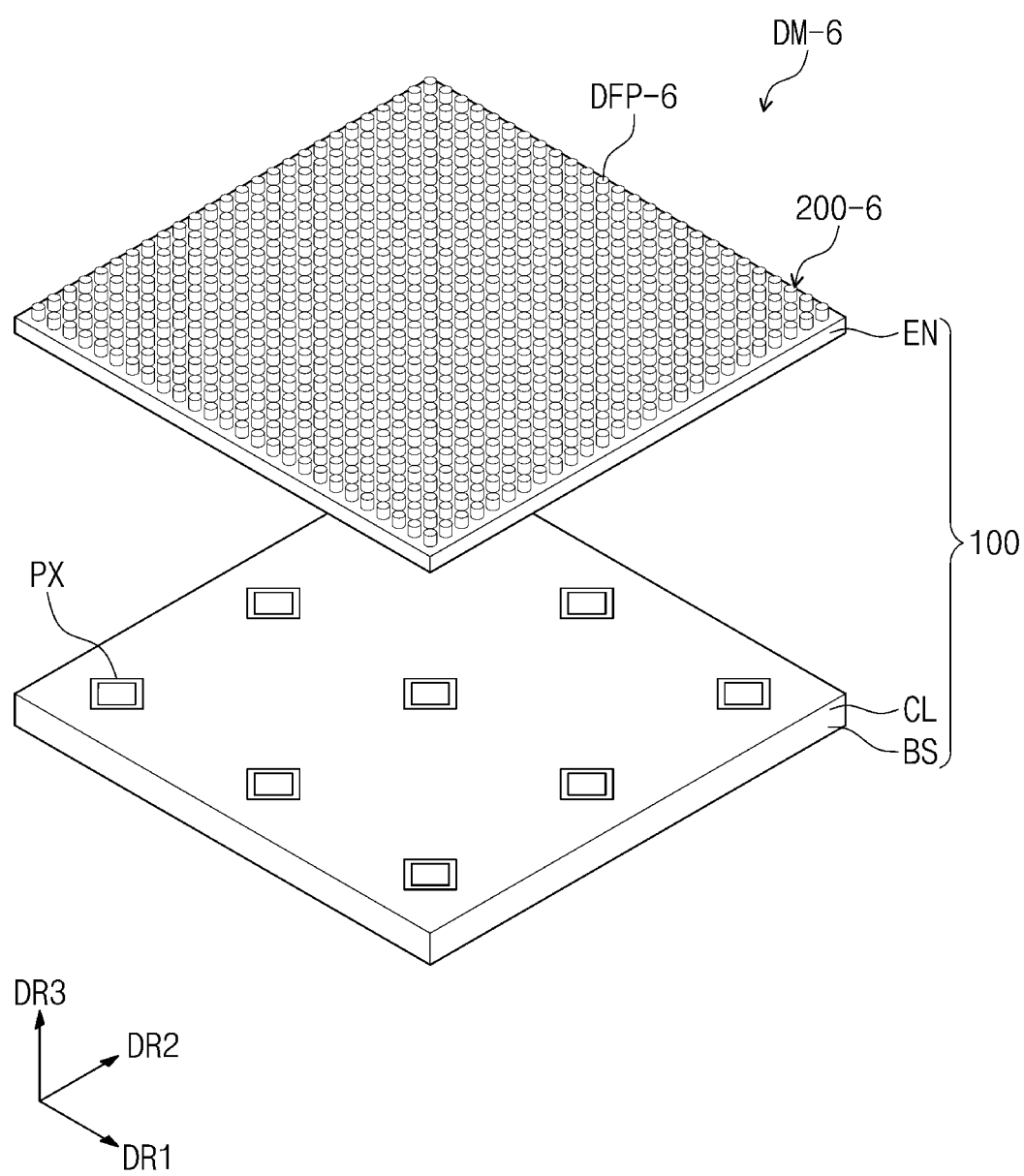
FIG. 18 is an enlarged perspective view illustrating a portion of a display module according to another embodiment of the inventive concept.

FIG. 18 is an enlarged perspective view illustrating a portion of an area of a display module according to another embodiment of the inventive concept.

For convenience of description, differences between this embodiment and the previous embodiments will primarily be described, and omitted descriptions may be derived from the previous embodiments. Same reference symbols are given to same components, and duplicated descriptions with respect to the previously described components may be omitted.

Referring to FIG. 18, a display module DM-6 according to another embodiment of the inventive concept includes a plurality of diffraction patterns DFP-6. The diffraction patterns DFP-6 are arranged in the form of a matrix having a plurality of rows and columns in the first direction DR1 and the second direction DR2 on the pattern layer 200-6. The diffraction patterns DFP-6 are arranged at an interval (e.g., a constant interval).

According to this embodiment, each of the diffraction patterns DFP-6 has a shape that protrudes upward from a top surface of an encapsulation layer EN. That is, each of the diffraction patterns DFP-6 has a protruding (e.g., relief or embossed) shape. The diffraction patterns DFP-6 define the above-described pattern layer 200-6. Each of the diffraction patterns DFP-6 may include the same material as the encapsulation layer EN. According to another embodiment of the inventive concept, the diffraction patterns DFP-6 may be integrated with the encapsulation layer EN.

Although not shown in the drawings, a pattern layer 200-6 according to another embodiment of the inventive concept may further include a cover layer CVL disposed on the diffraction patterns DFP-6. The cover layer CVL covers the diffraction patterns DFP-6. In this embodiment, the cover layer CVL may perform a planarization function.

According to the embodiment of the inventive concept, the display quality of the display apparatus may be improved. Particularly, the luminance uniformity may be improved.

It will be apparent to those skilled in the art that various modifications and variations can be made in the inventive concept. Thus, it is intended that the present disclosure covers the modifications and variations of this invention provided they come within the scope of the appended claims and their equivalents. Thus, to the maximum extent allowed by law, the scope of the present invention is to be determined by the broadest reasonable interpretation of the following claims and their equivalents, and shall not be restricted or limited by the foregoing detailed description.

What is claimed is:

1. A display apparatus comprising a display module configured to define a display surface on a plane,
    the display module comprising:
        a plurality of light emitting elements configured to display an image on the display surface;
        a cover layer configured to cover the plurality of light emitting elements; and
        a pattern layer on the cover layer and having a same refractive index as the cover layer,
    wherein the pattern layer comprises a plurality of diffraction patterns,
    the plurality of diffraction patterns comprises:
    first patterns, each of which has a first width; and
    second patterns, each of which has a second width greater than the first width,
    each of the first patterns and the second patterns has a plurality of hole shapes passing through the pattern layer, and the first patterns and the second patterns have a constant interval configured to constructively interfere with at least a portion of incident light generated by the plurality of light emitting elements, and
    light from a light emitting element of the plurality of light emitting elements comprises a first sub light incident on a first pattern of the first patterns and a second sub light incident on a second pattern of the second patterns, and a difference in light paths of the first sub light and the second sub light is proportional to a wavelength of the light, such that the first sub light and the second sub light are constructively interfered.

2. The display apparatus of claim 1, wherein the at least the portion of incident light diffracted by the plurality of diffraction patterns is constructively interfered.

3. The display apparatus of claim 2, wherein each of the plurality of light emitting elements is configured to display pixel unit images on the display surface,
    constructively interfered incident light displays duplicate pixel unit images between adjacent light emitting elements, and
    the image is defined by the pixel unit images and the duplicate pixel unit images.

4. The display apparatus of claim 1, wherein a ratio of the second patterns to the first patterns on the pattern layer is in a range of about 20% to about 80%.

5. The display apparatus of claim 1, wherein a number of the first patterns is the same as that of the second patterns on the pattern layer.

6. The display apparatus of claim 1, wherein a ratio of the width of each of the plurality of diffraction patterns to an interval of the plurality of diffraction patterns is in a range of about 5% to about 95%.

7. The display apparatus of claim 1, wherein the plurality of diffraction patterns further comprises third patterns, each of which has a third width that is less than the first width.

8. The display apparatus of claim 1, wherein first columns of the first patterns and second columns of the second patterns are alternately arranged.

9. The display apparatus of claim 1, wherein the first patterns and the second patterns are alternately arranged on the plane in a first direction and a second direction perpendicular to the first direction.

10. The display apparatus of claim 1, wherein the display module further comprises:
a base layer; and
a circuit layer on the base layer and comprising the plurality of light emitting elements, and
the cover layer is disposed on the circuit layer and has a same refractive index as the pattern layer.

11. The display apparatus of claim 10, wherein the cover layer comprises a same material as the pattern layer.

12. The display apparatus of claim 1, wherein each of the plurality of diffraction patterns has a shape that protrudes upward from a top surface of the display module.

13. The display apparatus of claim 1, wherein each of the plurality of diffraction patterns has a circular shape on the plane.

14. The display apparatus of claim 1, wherein each of the plurality of diffraction patterns has a polygonal shape on the plane.

15. The display apparatus of claim 1, further comprising an antireflection layer on the display module,
wherein the antireflection layer comprises:
a phase retardation layer configured to retard a phase of one component of the incident light; and
a polarizing layer on the phase retardation layer.

16. A display apparatus comprising:
a base layer;
a display layer on the base layer and comprising a plurality of light emitting elements;
a cover layer on the display layer; and
a pattern layer comprising a same material as the cover layer,
wherein the pattern layer comprises a plurality of diffraction patterns comprising:
first patterns, each of which has a first width; and
second patterns, each of which has a second width greater than the first width,
wherein each of the first patterns and the second patterns has a plurality of hole shapes passing through the pattern layer, and the first patterns and the second patterns have a constant interval such that the first patterns are configured to cause constructive light interference with the second patterns, and
light from a light emitting element of the plurality of light emitting elements comprises a first sub light incident on a first pattern of the first patterns and a second sub light incident on a second pattern of the second patterns, and a difference in light paths of the first sub light and the second sub light is proportional to a wavelength of the light, such that the first sub light and the second sub light are constructively interfered.

* * * * *